United States Patent [19]
Huang

[11] Patent Number: 5,736,672
[45] Date of Patent: Apr. 7, 1998

[54] MAGNETIC NOISE ELIMINATOR

[76] Inventor: Yi-Chung Huang, 463 Kang-Ning Street, Hsi-Che, Taipei Hsien, Taiwan

[21] Appl. No.: 593,357
[22] Filed: Jan. 29, 1996
[51] Int. Cl.⁶ .................................................. H05K 9/00
[52] U.S. Cl. ............................ 174/35 R; 333/12; 336/92
[58] Field of Search ...................... 174/35 R, 35 MS, 174/92, 138 F; 336/84 R, 84 M, 92; 333/12; 361/816, 818; 439/607, 608, 609, 610

[56] References Cited

U.S. PATENT DOCUMENTS

| | | | |
|---|---|---|---|
| 3,757,031 | 9/1973 | Izraeli | 174/138 F |
| 4,219,693 | 8/1980 | French | 174/135 |
| 4,885,559 | 12/1989 | Nakano | 336/92 |
| 4,963,700 | 10/1990 | Olsen et al. | 174/138 |
| 4,970,476 | 11/1990 | Kitagawa | 333/12 |

Primary Examiner—Bot L. Ledynh
Assistant Examiner—Hung V. Ngo
Attorney, Agent, or Firm—Beveridge, DeGrandi, Weilacher & Young, LLP

[57] ABSTRACT

A magnetic noise eliminator mounted around the signal line of a computer or the like to stabilize the magnetic field produced by the signal line and to protect it against outside noise. The magnetic noise eliminator has two symmetrical cover shells connected together by forcing the longitudinal teeth and longitudinal grooves of one cover shell into engagement with the longitudinal grooves and longitudinal teeth of the other, and two longitudinally grooved magnetic blocks abutted together by forcing the longitudinal flange and longitudinal recess of one magnetic block into engagement with the longitudinal recess and longitudinal flange of the other.

3 Claims, 2 Drawing Sheets

MAGNETIC NOISE ELIMINATOR

BACKGROUND OF THE INVENTION

The present invention relates to a magnetic noise eliminator mounted around the signal line of a computer or the like to stabilize its magnetic field, and to protect it against the interference of outside noise, and relates more particularly to such a magnetic noise eliminator which comprises two symmetrical blocks made from magnetic material and connected together around the signal line of a computer or the like, and two symmetrical cover shells fastened together to hold the symmetrical blocks on the inside.

The transmission of a signal on a signal line of an instrument, for example, a computer, tends to be interfered by outside magnetic waves. Various noise filter and eliminator means have been developed for use to protect the signal line of an instrument against the interference of outside noises. FIG. 4 shows a magnetic noise eliminator according to the prior art which is made from magnetic material of cylindrical shape. This magnetic noise eliminator is functional, however it cannot be easily mounted around the signal line of the instrument after the instrument is installed. Furthermore, this cylindrical magnetic noise eliminator fits only a particular diameter of signal line. Therefore, it cannot fit different instruments.

SUMMARY OF THE INVENTION

The present invention has been accomplished to provide a magnetic noise eliminator which eliminates the aforesaid drawbacks. It is one object of the present invention to provide a magnetic noise eliminator which can be easily and quickly mounted on the signal line of an instrument which is installed. It is another object of the present invention to provide a magnetic noise eliminator which can be conveniently adjusted to fit different sizes of signal line. According to one aspect of the present invention, the magnetic noise eliminator includes two symmetrical cover shells connected together by forcing the longitudinal teeth and longitudinal grooves of one cover shell into engagement with the longitudinal grooves and longitudinal teeth of the other, and two longitudinally grooved magnetic blocks abutted together by forcing the longitudinal flange and longitudinal recess of one magnetic block into engagement with the longitudinal recess and longitudinal flange of the other. According to another aspect of the present invention, two cushions can be respectively mounted in between the magnetic blocks at two opposite sides to adjust the diameter of the tubular longitudinal passage for signal line.

DETAILED DESCRIPTION OF THE PREFERRED EMBODIMENT

Figure 1:
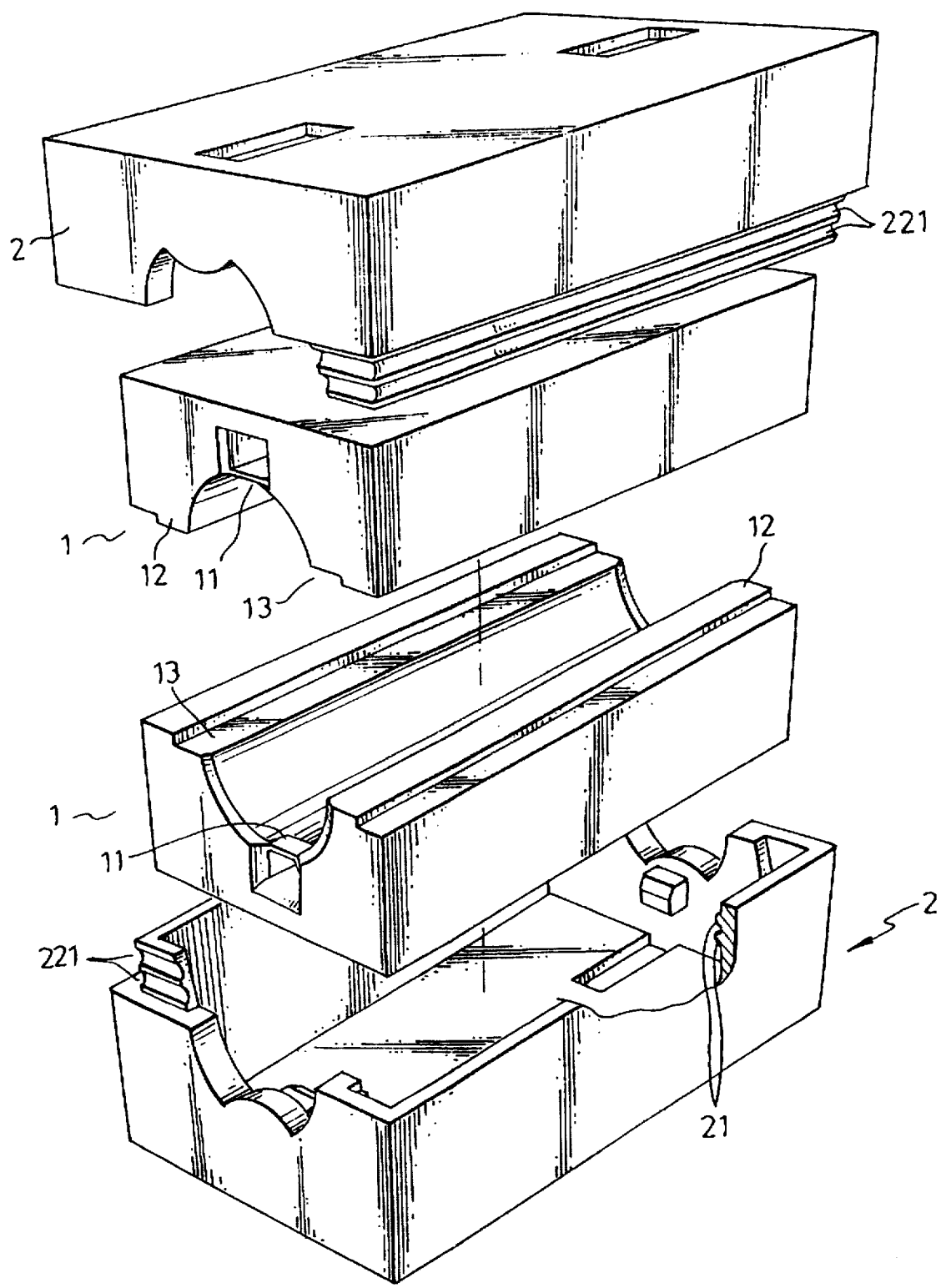
FIG. 1 is an exploded view of the present invention, showing the structure of the magnetic noise eliminator thereof.
Figure 2:
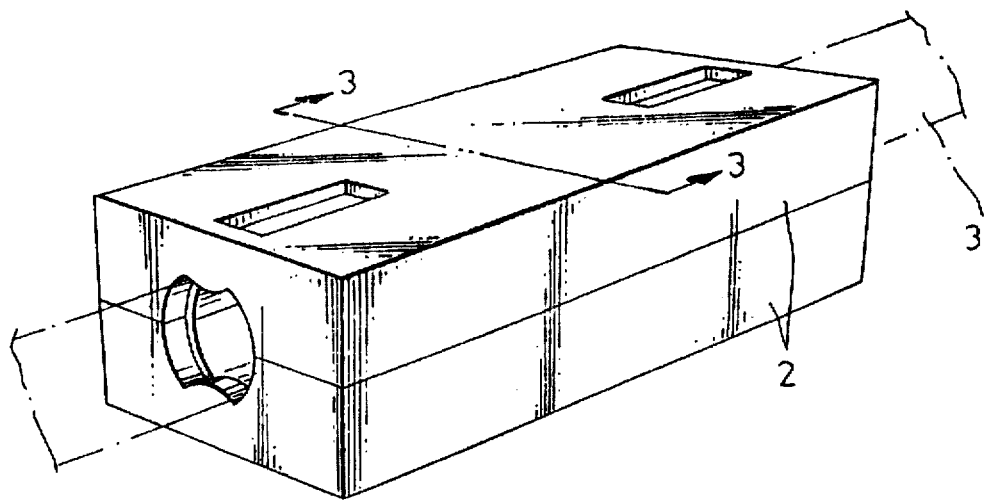
FIG. 2 is an elevational view of the magnetic noise eliminator shown in FIG. 1.
Figure 3:
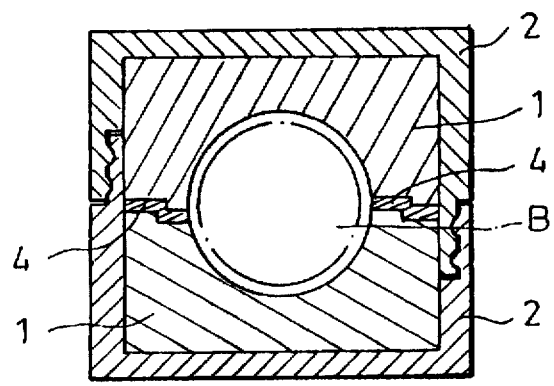
FIG. 3 is a cross sectional view taken along line 3—3 of FIG. 3.
Figure 4:
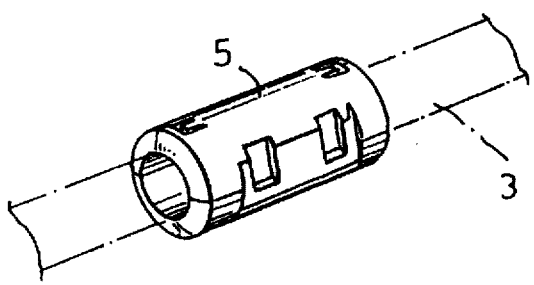
FIG. 4 shows a magnetic noise eliminator according to the prior art.

Referring to FIGS. 1, 2, and 3, a magnetic noise eliminator in accordance with the present invention is generally comprised of two symmetrical magnetic blocks 1 made from magnetic material and secured together around the signal line 3 of an instrument for example a computer, and two symmetrical cover shells 2 fastened together to hold the magnetic blocks 1 on the inside. Each of the symmetrical magnetic blocks 1 comprises a longitudinal trough 11 of half-round cross section at one side through the length, a longitudinal flange 12 raised along one side of the longitudinal trough 11, and a longitudinal recess 13 disposed along an opposite side of the longitudinal trough of half-round cross section 11. When the magnetic blocks 1 are abutted against each other by engaging the longitudinal flange 12 and longitudinal recess 13 of one magnetic block with the longitudinal recess 13 and longitudinal flange 12 of the other, the longitudinal troughs 11 of the symmetrical magnetic blocks 1 are connected together and form a tubular passage B (see FIG. 3) for the insertion of the signal line 3 of the computer. Each of the cover shells 2 includes a plurality of longitudinal teeth 221 vertically spaced at one side, and a plurality of longitudinal grooves 21 vertically spaced at an opposite side. By forcing the longitudinal teeth 221 and longitudinal grooves 21 of one cover shell 2 into engagement with the longitudinal grooves 21 and longitudinal teeth 211 of the other, the cover shells 2 are connected together to hold the magnetic blocks 1 on the inside. Furthermore, the two opposite ends of the cover shells 2 fit over the two opposite ends of the magnetic blocks 1 so that the signal line 3 can pass out of the cover shells 2.

Referring to FIG. 3 again, during the assembly process, two cushions 4 of suitable thickness are respectively mounted between the symmetrical magnetic blocks 1 at two opposite sides of the tubular passage B, and are retained between the respective longitudinal flanges 12 and the respective longitudinal recesses 13 to adjust the diameter of the tubular passage B subject to the diameter of the signal line 3. When the computer is operated, the magnetic noise eliminator stabilizes the magnetic field of the signal line 3, and eliminates the interference of noises.

It is to be understood that the drawings are designed for purposes of illustration only, and are not intended as a definition of the limits and scope of the invention disclosed.

What the invention claimed is:

1. A magnetic noise eliminator for fitting around a signal line comprising:

a cover formed by two identical cover shells in engagement with each other, two identical magnetic blocks in engagement with each other and disposed within said two cover shells;

each of said two cover shells having:

a plurality of teeth vertically spaced from each other and extending longitudinally along one edge of said each cover shell and spaced inwardly and downwardly from said one edge, and a plurality of grooves extending longitudinally along an inner wall of said each cover shell adjacent an edge of said each cover shell opposite the one edge having said teeth, said plurality of spaced teeth of one of said cover shell extending into and engaging said grooves of the other of said cover shell and forming said cover, each of said two magnetic blocks having:

a trough longitudinally extending therethrough, a flange longitudinally extending along one edge of said each magnetic block, and a recess longitudinally extending along an edge of said trough opposite said flange, with said flange of said each magnetic block in contact with the recess on the other respective magnetic block, whereby said troughs of said two magnetic blocks form a passageway longitudinally extending through said engaged magnetic blocks for the signal line to be held therein, said two cover shells encompassing said two magnetic blocks and holding said two symmetrical magnetic blocks in engagement with each other.

2. A magnetic noise eliminator as defined in claim 1, wherein said two cover shells have a rectangular shape, and said two magnetic blocks have a rectangular shape.

3. A magnetic noise eliminator as defined in claim 2, wherein a pair of cushions are inserted one each on either side of said passageway formed by said troughs between said pair of two magnetic blocks.

* * * * *